(12) United States Patent
Ochiai

(10) Patent No.: US 12,294,351 B2
(45) Date of Patent: May 6, 2025

(54) ACOUSTIC WAVE DEVICE WITH MINI BUS BARS

(71) Applicant: SKYWORKS SOLUTIONS, INC., Irvine, CA (US)

(72) Inventor: Akira Ochiai, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 216 days.

(21) Appl. No.: 18/062,665

(22) Filed: Dec. 7, 2022

(65) Prior Publication Data
US 2023/0198497 A1    Jun. 22, 2023

Related U.S. Application Data

(60) Provisional application No. 63/292,607, filed on Dec. 22, 2021.

(51) Int. Cl.
*H03H 9/145* (2006.01)
*H03H 9/02* (2006.01)
(Continued)

(52) U.S. Cl.
CPC .... *H03H 9/14544* (2013.01); *H03H 9/02834* (2013.01); *H03H 9/25* (2013.01); *H03H 9/6483* (2013.01)

(58) Field of Classification Search
CPC .... H03H 9/25; H03H 9/6483; H03H 9/02992; H03H 9/14541; H03H 9/02834; H03H 9/1457; H03H 9/725; H03H 9/02559; H03H 9/02574; H03H 9/145; H03H 9/02858; H03H 9/02637; H03H 9/02881; H03H 9/64; H03H 9/6436; H03H 9/0009; H03H 9/02937; H03H 9/02866; H03H 9/02228; H03H 9/0274; H03H 9/13; H03H 9/131; H03H 9/1452; H03H 9/14582; H03H 3/08; H03H 9/02818; H03H 9/14526; H03H 9/14538; H03H 9/173; H03H 9/6406; H03H 9/6489; H03H 9/6496
See application file for complete search history.

(56) References Cited

U.S. PATENT DOCUMENTS 7,965,155 B2    6/2011 Nakamura et al.
9,035,725 B2    5/2015 Komatsu et al.
(Continued)

*Primary Examiner* — Lincoln D Donovan
*Assistant Examiner* — Tyler J Pereny
(74) *Attorney, Agent, or Firm* — Lando & Anastasi, LLP

(57) ABSTRACT

An acoustic wave device, and an acoustic wave filter and electronics module including the same. The acoustic wave device comprises a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers. The acoustic wave device allows for improvements in power durability when used in an acoustic wave filter, without an increase in size of the acoustic wave filter.

17 Claims, 7 Drawing Sheets

(51) Int. Cl.
  *H03H 9/25*  (2006.01)
  *H03H 9/64*  (2006.01)

(56) References Cited

U.S. PATENT DOCUMENTS

| | | |
|---|---|---|
| 9,257,960 B2 | 2/2016 | Ruile et al. |
| 9,640,750 B2 | 5/2017 | Nakanishi et al. |
| 9,998,092 B2 | 6/2018 | Taniguchi |
| 10,673,410 B2 | 6/2020 | Shoda |
| 11,496,116 B2 | 11/2022 | Takata |
| 2018/0351531 A1* | 12/2018 | Ruile ................ H03H 9/02818 |
| 2021/0126618 A1 | 4/2021 | Hiramatsu et al. |
| 2022/0123720 A1* | 4/2022 | Garcia ................... H03H 9/171 |
| 2022/0158624 A1* | 5/2022 | Hsiao .................... H03H 9/542 |

* cited by examiner

ACOUSTIC WAVE DEVICE WITH MINI BUS BARS

CROSS-REFERENCE TO RELATED APPLICATIONS

This application claims priority under 35 U.S.C. § 119(e) to U.S. Provisional Patent Application Ser. No. 63/292,607, titled "ACOUSTIC WAVE DEVICE WITH MINI BUS BARS," filed Dec. 22, 2021, the entire contents of which is incorporated herein by reference for all purposes.

BACKGROUND

Field

Aspects and embodiments disclosed herein relate to an acoustic wave device, an acoustic wave filter, and an electronics module comprising at least one acoustic wave filter.

Description of the Related Technology

An acoustic wave filter can include a plurality of resonators arranged to filter a radio frequency signal. Example acoustic wave filters include surface acoustic wave (SAW) filters. An acoustic wave filter can be arranged to filter a radio frequency (RF) signal and can be implemented in a radio frequency electronic system. For instance, filters in a radio frequency front end of a mobile phone can include acoustic wave filters. Two acoustic wave filters can be arranged as a duplexer.

FIG. 1 shows an example of a known acoustic wave filter 100. The acoustic wave filter 100 includes an input/output terminal 110 and an antenna (ANT) 120. A plurality of resonator arrays RA1, RA2 . . . RA10 are connected between the input/output terminal 110 and the antenna 120. In use, the terminal 110 receives a signal to be transmitted which is sent to the antenna 120 via the plurality of resonator arrays RA1, RA2 . . . RA10. Alternatively, a signal is received at the antenna 120 and is sent to the terminal 110 via the plurality of resonator arrays RA1, RA2 . . . RA10. In either case, the plurality of resonator arrays filter the signal.

FIG. 2 shows a circuit diagram of the acoustic wave filter 100 of FIG. 1. An inductor 130 is connected between the antenna 120 and ground. The inductor 130 may be a 10 nH, Q20 inductor (where Q20 means the minimum quality factor is equal to 20). Each of the resonator arrays RA1, RA2 . . . RA10 includes one or more surface acoustic wave (SAW) resonators. The surface acoustic wave resonators each include an interdigital transducer (IDT), and may include a pair of reflector gratings on either side of the IDT. Each IDT includes a pair of bus bars and a plurality of interleaving electrode fingers extending from the bus bars. The bus bars may have a width of at least 5 μm in a direction parallel to the extension of the electrode fingers (in other words, perpendicular to the direction of propagation of the surface acoustic wave generated by the IDT).

Minimizing the size of acoustic wave devices/resonators and acoustic wave filters, for example, SAW filters, duplexers and diplexers, is highly desirable for future small module developments. However, a better power durability for acoustic wave devices is also important. Present solutions to increase power durability often result in an increase in size of an acoustic wave device.

SUMMARY

According to one embodiment there is provided an acoustic wave device. The acoustic wave device comprises a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers.

In one example the first bus bar has a width of 1 μm or less in a direction parallel to the extension of the first plurality of electrode fingers, and the second bus bar has a width of 1 μm or less in a direction parallel to the extension of the second plurality of electrode fingers.

In one example the first bus bar and second bus bar are parallel and opposing.

In one example the first plurality of electrode fingers and second plurality of electrode fingers alternate in a direction perpendicular to the extension of the first plurality of electrode fingers and second plurality of electrode fingers.

In one example a separation between each of the first plurality of electrode fingers and an adjacent one of the second plurality of electrode fingers is equal to a distance of $\lambda/2$, where $\lambda$ is the wavelength of a surface acoustic wave generated by the first interdigital transducer electrode and second interdigital transducer electrode.

In one example the first interdigital transducer electrode and second interdigital transducer electrode include at least one of aluminum, titanium, chromium, molybdenum, tungsten, copper, gold, silver, platinum, ruthenium, or iridium.

In one example the acoustic wave device further comprises a layer of piezoelectric material.

In one example the first and second interdigital transducer electrodes are disposed on a surface of the layer of piezoelectric material.

In one example the acoustic wave device further comprises a layer of dielectric material.

In one example the layer of dielectric material is disposed over the first and second interdigital transducer electrodes.

In one example the acoustic wave device is one of a surface acoustic wave device or a surface acoustic wave resonator.

According to another embodiment there is provided an acoustic wave filter. The acoustic wave filter comprises a plurality of acoustic wave devices, at least one of the plurality of acoustic wave devices including a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers.

In one example all of the plurality of acoustic wave devices include a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers.

In one example the first bus bar has a width of 1 μm or less in a direction parallel to the extension of the first plurality of electrode fingers, and the second bus bar has a width of 1 μm or less in a direction parallel to the extension of the second plurality of electrode fingers.

In one example the plurality of acoustic wave devices includes at least one array including two or more cascaded acoustic wave devices.

In one example the plurality of acoustic wave devices includes an array with a cascade of more than five acoustic wave devices.

In one example the acoustic wave filter further comprises an inductor connected in series between an input/output terminal and the plurality of acoustic wave devices.

In one example an input breakage power of the acoustic wave filter is greater than 31 decibel-milliwatts.

According to another embodiment there is provided an electronics module. The electronics module comprises at least one acoustic wave filter that includes a plurality of acoustic wave devices, at least one of the acoustic wave devices including a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers.

In one example the first bus bar has a width of 1 μm or less in a direction parallel to the extension of the first plurality of electrode fingers, and the second bus bar has a width of 1 μm or less in a direction parallel to the extension of the second plurality of electrode fingers.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment," or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an acoustic wave device, and an acoustic wave filter and electronics module including the same. The acoustic wave device comprises a first interdigital transducer electrode having a first bus bar and a first plurality of electrode fingers extending from the first bus bar, the first bus bar having a width of 3 μm or less in a direction parallel to the extension of the first plurality of electrode fingers, and a second interdigital transducer electrode having a second bus bar and a second plurality of electrode fingers extending from the second bus bar and interleaved with the first plurality of electrode fingers, the second bus bar having a width of 3 μm or less in a direction parallel to the extension of the second plurality of electrode fingers. The acoustic wave device allows for improvements in power durability when used in an acoustic wave filter, without an increase in size of the acoustic wave filter.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 3:
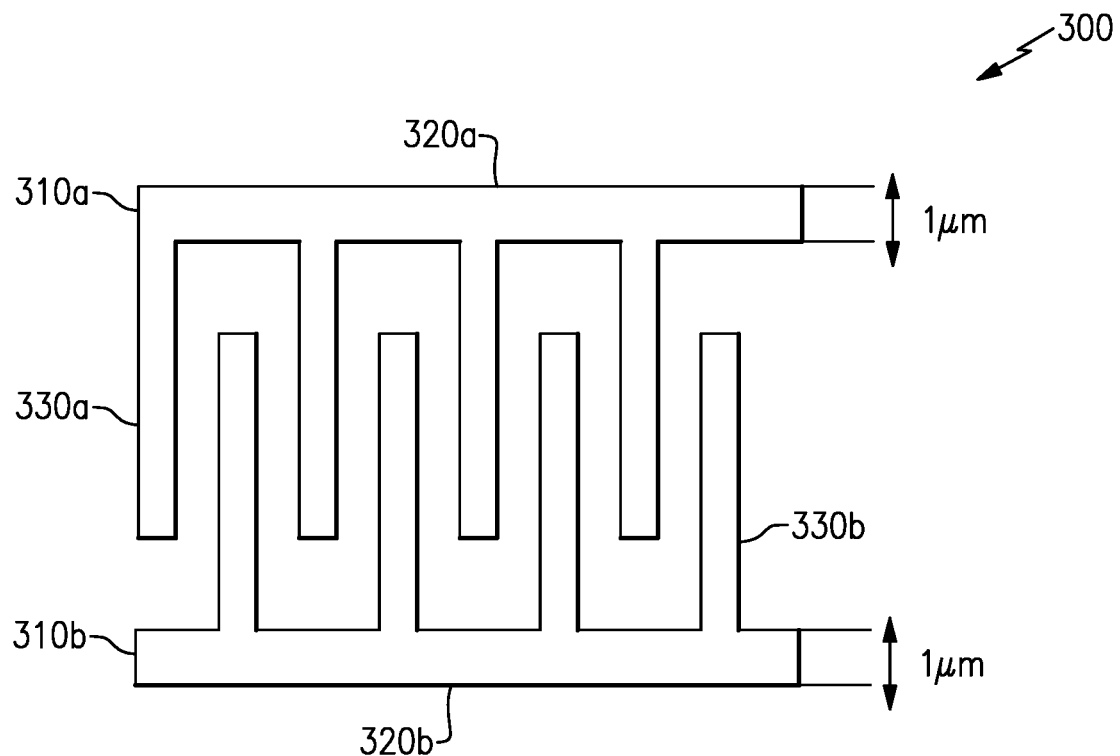
FIG. 3 shows an acoustic wave device according to an embodiment of the present disclosure.

FIG. 3 shows a portion of an acoustic wave device 300 according to an embodiment of the present invention. The portion of the acoustic wave device 300 is an interdigital transducer (IDT), and will also be referred to as IDT 300 herein. The IDT 300 can be used in an acoustic wave device such as a surface acoustic wave (SAW) resonator.

The IDT 300 includes a pair of interlocking comb shaped electrodes 310a, 310b, each electrode including a bus bar 320a, 320b and a plurality of electrode fingers 330a, 330b. The electrode fingers 330a, 330b of a given electrode 310a, 310b extend from the bus bar 320a, 320b of that electrode 310a, 310b, typically perpendicularly, towards the bus bar 320a, 320b in the opposite electrode. The electrode fingers 330a, 330b are typically parallel to each other. The bus bars 320a, 320b may be parallel and opposing. The electrode fingers 330a, 330b of each comb shaped electrode interleave with the electrode fingers of the opposite comb shaped electrode. In the present embodiment, the electrode fingers 330a, 330b alternate between those extending from the bus bar 320a of the first comb shaped electrode 310a, and those extending from the bus bar 320b of the second comb shaped electrode 310b, moving in a direction perpendicular to the extension of the electrode fingers (in the direction of propagation of the main surface acoustic wave generated by the IDT).

The IDT 300 is configured to generate a main surface acoustic wave having a wavelength λ in response to an input electrical signal. The main surface acoustic wave generated by the IDT 300 travels perpendicular to the lengthwise direction of the IDT fingers 330a, 330b, and parallel to the lengthwise direction of the IDT bus bars 320a, 320b. Typically the distance between the central points of each adjacent electrode finger 330a, 330b extending from the same bus bar 320a, 320b is equal to the wavelength of the surface acoustic wave generated. The bus bars 320a, 320b of each IDT electrode are parallel and opposing each other, and the plurality of fingers 330a, 330b of each IDT electrode extend towards to the bus bar 320a, 320b of the opposing electrode, such that the fingers 330a, 330b interlock, typically with a distance of λ/2 between the center of each adjacent finger extending from the opposite bus bars. In a specific embodiment, the width of each electrode finger is 0.35 μm in the direction parallel to the direction of propagation of the main surface acoustic wave generated by the IDT.

The IDT electrodes may be single layered electrodes. In general the IDT may be formed out of various conductive materials. For example, the IDT may contain at least one of aluminum, titanium, chromium, molybdenum, tungsten, copper, gold, silver, platinum, ruthenium, and/or iridium. Multilayered electrodes may also be used, that include an upper layer of a highly conductive but low-density material, for example, aluminum (Al) or copper (Cu), or an aluminum-copper alloy, and a lower layer of a less conductive, but more dense material, for example, titanium (Ti), molybdenum (Mo), tungsten (W), gold (Au), silver (Ag), platinum (Pt), ruthenium (Ru), and/or nickel (Ni). The denser lower layer may reduce the acoustic velocity of acoustic waves travelling through the device which may allow the IDT electrode fingers to be spaced more closely for a given operating frequency and allow the acoustic wave device to be reduced in size as compared to a similar device utilizing less dense IDT electrodes. The less dense upper layer may have a higher conductivity than the lower layer to provide the electrodes with lower overall resistivity than if they were formed entirely of the denser material.

The IDT 300 (portion of acoustic wave device 300) of the present embodiment can be used in a SAW filter device. In a SAW filter a plurality of SAW resonators are arranged to form the SAW filter. The SAW resonators may be arranged in resonator arrays, with multiple resonator arrays being connected to form the SAW filter. Each resonator array includes one or more SAW resonators, which may be cascade connected. Here cascade connected refers to two or more SAW resonators being electrically connected in series or parallel. Each SAW resonator includes at least one IDT. In known filter circuits, such as that shown in FIGS. 1 and 2, the IDT bus bars in each SAW resonator have a width of at least 5 μm. The width of these bus bars sets a limit on how many resonators can be cascaded in a given area, and therefore set a limit on the size of a resonator array including a given number of cascaded SAW resonators.

In contrast, in accordance with aspects and embodiments of the present invention the bus bars 320a, 320b of the portion of the acoustic wave device 300 have a width of 3 μm or less in a direction parallel to the extension of the electrode fingers 330a, 330b. Such bus bars with a width of 3 μm or less may be referred to as mini bus bars. These mini bus bars, when used in the SAW resonators, allow a larger number of SAW resonators to be cascaded within a resonator array of a given area. In other words, each SAW resonator including an IDT 300 with mini bus bars takes up less area. This means that a SAW filter or resonator array can be miniaturized by using IDTs 300 with mini bus bars 320a, 320b.

Additionally, in many instances it is desirable to improve the power durability of a SAW filter without increasing the size of the SAW filter. Power durability is the ability for an acoustic wave device to handle higher frequencies and/or input powers (in other words, higher energy intensities). Increasing the number of SAW resonators within a SAW filter can lead to an increase in power durability, however this will also result in an increase in size of the SAW filter module when known 5 μm wide bus bar IDTs are used, such as those in FIGS. 1 and 2. The portion of the acoustic wave device 300 of the present invention including mini bus bars allows a greater number of SAW resonators to fit (or be cascade connected) in a given area, meaning more SAW resonators may be used in a SAW filter without increasing the size of the filter, thus increasing power durability without a corresponding increase in size of the filter. This will be discussed in more detail in relation to FIGS. 5 to 8 below.

Preferably, the bus bars 320a, 320b have a width of 2 μm or less in a direction parallel to the extension of the electrode fingers 330a, 330b. More preferably, the bus bars 320a, 320b have a width of 1 μm or less in a direction parallel to the extension of the electrode fingers 330a, 330b. The specific embodiment in FIG. 3 shows an acoustic wave device 300 with bar bars 320a, 320b with a width of 1 μm in a direction parallel to the extension of the electrode fingers 330a, 330b. Using mini bus bars with a width less than 2 μm or 1 μm means that an even larger size reduction of a SAW filter can be achieved, or a greater improvement in the power durability can be achieved without a size increase.

The portion of the acoustic wave device 300 can be used in a SAW filter to provide a better power durability without any increase in size of the SAW filter module. Additionally the portion of the acoustic wave device 300 can allow miniaturization of a SAW filter device, without the need to remove any SAW resonators from the filter device, thus preventing any reduction in power durability.

In a specific embodiment of the IDT 300, the separation between the opposing bus bars is in the range of approximately 40 μm to 200 μm. In a specific embodiment of the IDT 300, the length of the bus bars is in the range of approximately 100 μm to 400 μm.

The mini bus bars discussed above may be used in any type of IDT structure. Alternative and more complex IDT configurations may be used, for example, double interdigitated electrode IDTs are possible, where the electrode fingers are interleaved such that pairs of electrode fingers 330a from the first comb shaped electrode 310a alternate with pairs of electrode fingers 330b from the second comb shaped electrode 310b. IDTs including dummy electrodes may also be used, as may hammer head type IDTs where a duty factor of the IDT towards the tips of the electrode fingers is greater than the duty factor of the IDT in the central portion. In general any type of IDT may be used, as would be understood by the skilled person. Only eight electrode fingers are shown in FIG. 3, for exemplary purposes, however it is to be understood that any number of electrode fingers may be used in the IDT 300. A typical number of electrode fingers in the IDT is around 40 to 200.

Figure 4:
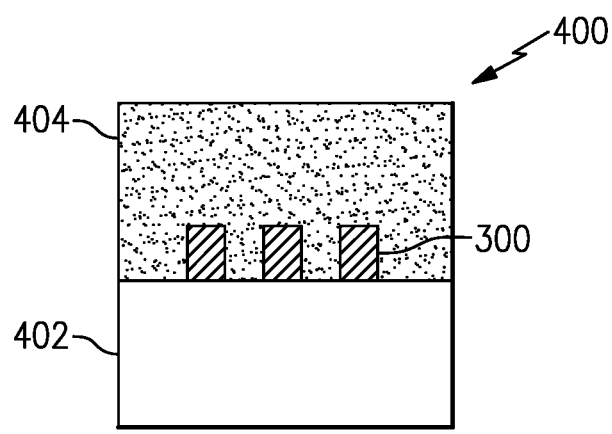
FIG. 4 shows a cross-sectional side view of an acoustic wave device according to an embodiment of the present disclosure.

The IDT 300 including mini bus bars could be utilized with various different types of SAW resonator. For example, FIG. 4 shows a cross-sectional side view of a portion of an acoustic wave device 400 according to an embodiment of the present invention. The acoustic wave device 400 is a SAW resonator. The SAW resonator 400 includes an IDT 300 including the mini bus bars, such as that show in FIG. 3. Only three electrode fingers are shown in FIG. 4, for exemplary purposes, however it is to be understood that any number of electrode fingers may be used in the IDT 300. The SAW resonator 400 may be used in the above mentioned SAW filter device and resonator arrays.

The SAW resonator 400 includes a layer of piezoelectric material 402 onto which the IDT 300 is disposed, and a layer of dielectric material 404 disposed on the layer of piezoelectric material 402 over the IDT 300. Any piezoelectric material may be used as the layer of piezoelectric material 402, including but not limited to lithium tantalate ($LiTaO_3$), aluminum nitrite (AlN), lithium niobate ($LiNbO_3$), or potassium niobate ($KNbO_3$). Various materials may also be used in the layer of dielectric material 404, such as is silicon dioxide ($SiO_2$). Other examples may include doped materials such as F doped $SiO_2$, or Ti doped $SiO_2$.

In a specific embodiment, layer of piezoelectric material 402 may be formed from 128.8 LN (lithium niobate, 90 degrees rotation), and the layer of dielectric material 404 may be a 430 nm thick or 360 nm thick layer of $SiO_2$.

In some embodiments, the SAW resonator 400 may include a pair of reflector gratings (not shown) disposed on the layer of piezoelectric material 402 and located on opposing sides of the IDT 300, sandwiching the IDT. Such reflector gratings may include 10 to 15 or more reflector fingers, with each finger separated by a distance equal to half the wavelength of the main surface acoustic wave generated by the IDT 300. The reflector gratings are configured to trap acoustic energy within the SAW resonator 400 between the reflector gratings.

The SAW resonator 400 of FIG. 4. is an example of a temperature compensated SAW resonator. The layer of dielectric material 404 may act as a temperature compensation layer, reducing the change in frequency response of the acoustic wave device with changes in temperature. A passivation layer (not shown) may be disposed on an upper surface of layer of dielectric material 404 (temperature compensation layer). The passivation layer performs frequency truncation and passivation. The passivation layer may be formed of silicon nitride ($Si_3N_4$, also abbreviated as "SiN" herein).

As mentioned, other types of SAW resonator could also be used. For example, in alternative embodiments the IDT 300 may be embedded within the layer of dielectric material 404 instead of being disposed on the layer of piezo electric material 402.

In alternative embodiments, a SAW resonator with a multilayer piezoelectric substrate could be used. In such embodiments, the SAW resonator may include a carrier substrate, a layer of dielectric material disposed on an upper surface of the carrier substrate, and a layer of piezoelectric material disposed on the layer of dielectric material. The IDT 300 and optionally a pair of reflector gratings may be disposed on top of the layer of piezoelectric material. One example of a material that may be utilized for the carrier substrate is silicon (Si), however aluminum nitride, silicon nitride, magnesium oxide spinel, magnesium oxide crystal, quartz, diamond, DLC (diamond like carbon), or sapphire may all also be used as the carrier substrate.

In general, the portion of the acoustic wave device 300 (IDT 300) with mini bus bars can be utilized in any type of SAW resonator, which in turn can be used in a SAW filter device, for example, in a resonator array and/or resonator cascade. When the mini bus bars are used, a larger number of SAW resonators can be cascaded within a given area.

Figure 5:
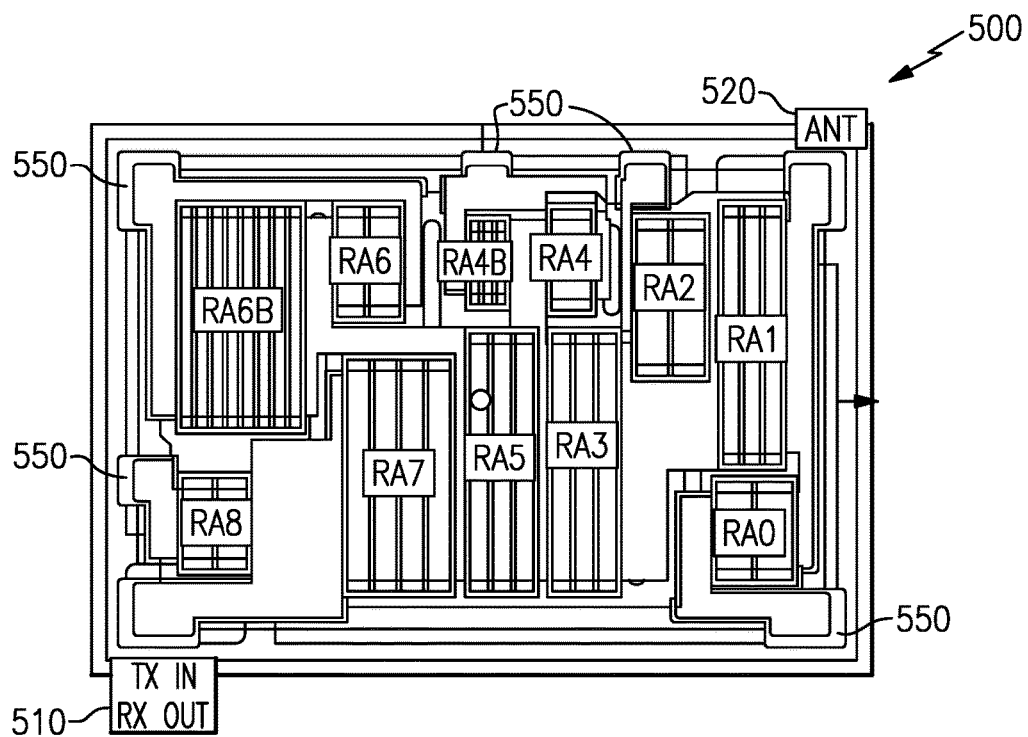
FIG. 5 shows an example of an acoustic wave filter according to an embodiment of the present disclosure.

FIG. 5 shows an example of an acoustic wave filter 500 according to an embodiment of the present invention. The acoustic wave filter may be a SAW filter and/or a radio frequency filter. The acoustic wave filter 500 includes an input/output terminal 510 and an antenna (ANT) 520. A plurality of resonator arrays RA0, RA1, RA2 . . . RA8 are connected between the input/output terminal 510 and the antenna 520. In use, the terminal 510 receives a signal to be transmitted which is sent to the antenna 520 via the plurality of resonator arrays RA0, RA1, RA2 . . . RA8. Alternatively, a signal is received at the antenna 520 and is sent to the terminal 510 via the plurality of resonator arrays RA0, RA1, RA2 . . . RA8. In either case, the plurality of resonator arrays filter the signal.

Figure 6:
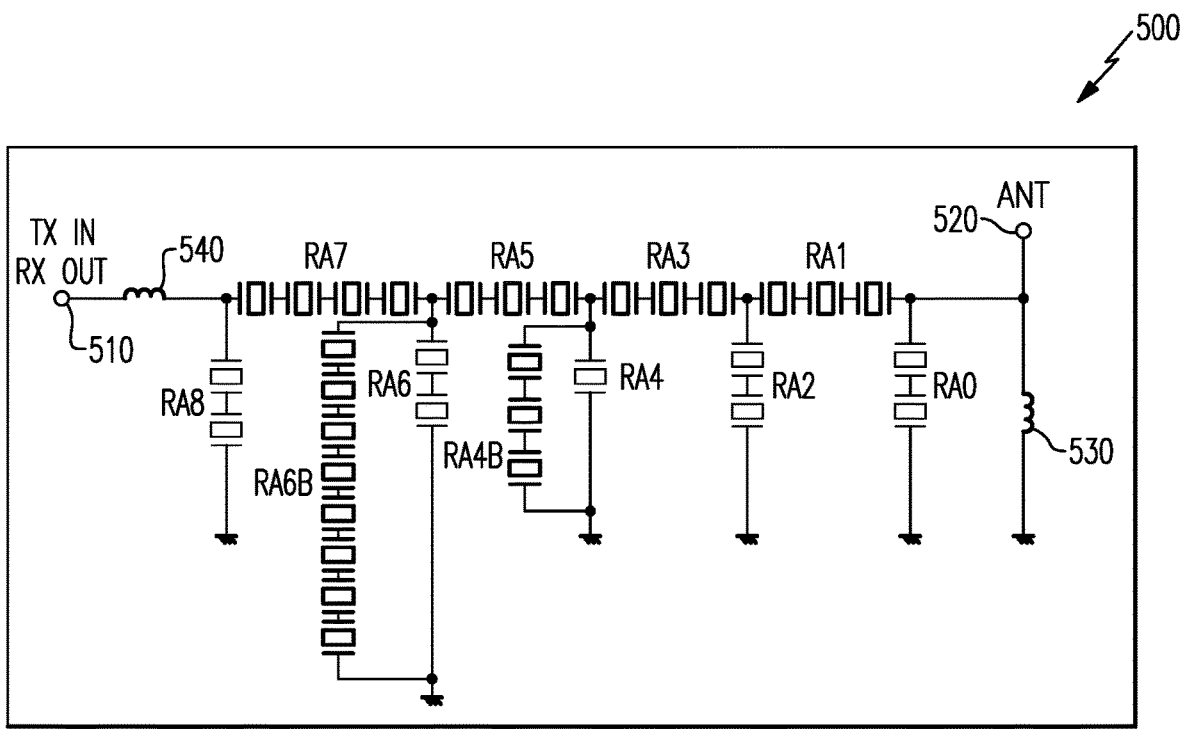
FIG. 6 shows a circuit diagram of the acoustic wave filter of FIG. 5.

FIG. 6 shows a circuit diagram of the acoustic wave filter 500 of FIG. 5. A first inductor 530 is connected between the antenna 520 and ground. A second inductor 540 is connected in series between the input/output terminal 510 and the plurality of resonator arrays RA0, RA1, RA2 . . . RA8. The plurality of resonator arrays RA0, RA1, RA2 . . . RA8 each include one or more SAW resonators. Each of these SAW resonators include IDTs 300 with mini bus bars with a width less than 3 μm, preferably less than 2 μm, more preferably less than 1 μm.

Using SAW resonators including IDTs with mini bus bars, such as IDT 300 of FIG. 3, means that the cascades of SAW resonators in each resonator array can include additional SAW resonators whilst occupying the same amount space. In particular, in the specific embodiment of FIG. 6, resonator array RA6B includes eight cascaded SAW resonators, compared to the four cascaded resonators included in resonator array RA6B in the filter 100 of FIG. 2. Similarly, resonator array RA7 in FIG. 6 includes an additional SAW resonator compared to array RA7 of the filter 100 in FIG. 2. The additional SAW resonators in the acoustic wave filter 500 improve the power durability, as will be discussed in relation to FIG. 8 later, without increasing the size of the acoustic wave filter 500.

In a specific embodiment, the first inductor 530 is a 9 nH, Q20 inductor, and the second inductor 540 is a 0.1 nH, Q20 inductor. Compared to the inductor 130 of FIG. 2, using an inductor with a smaller inductance as the first inductor 530 means that the loss will be smaller. The second inductor 540 is connected between the input/output terminal 510 and resonator arrays RA7 and RA8, and acts as a matching component on the module.

Figure 1:
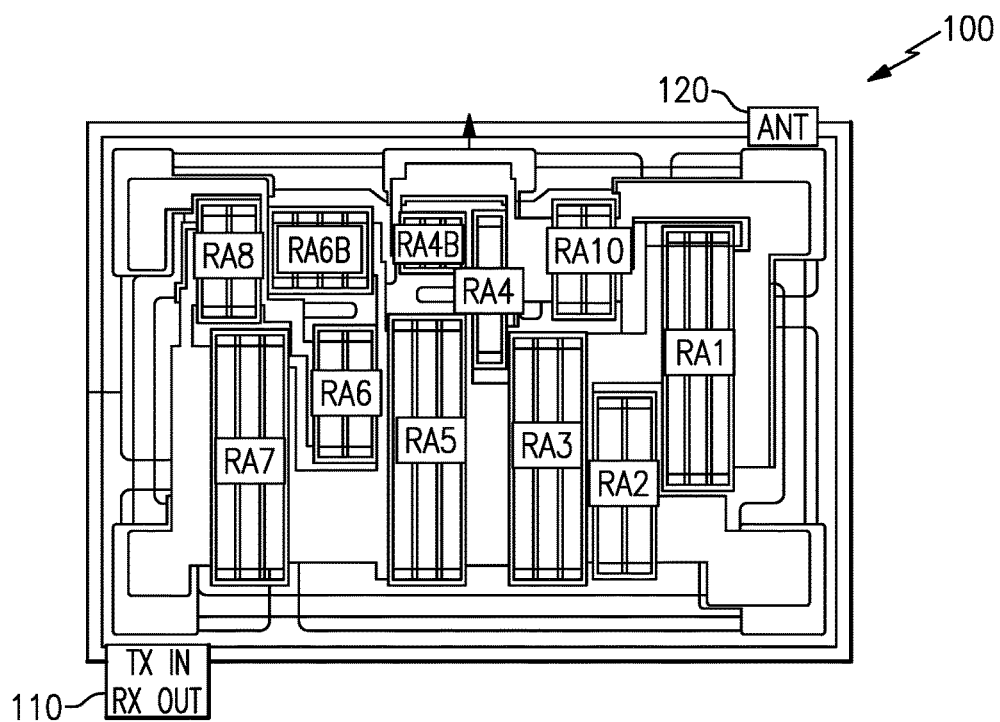
FIG. 1 shows an example of a known acoustic wave filter.
Figure 2:
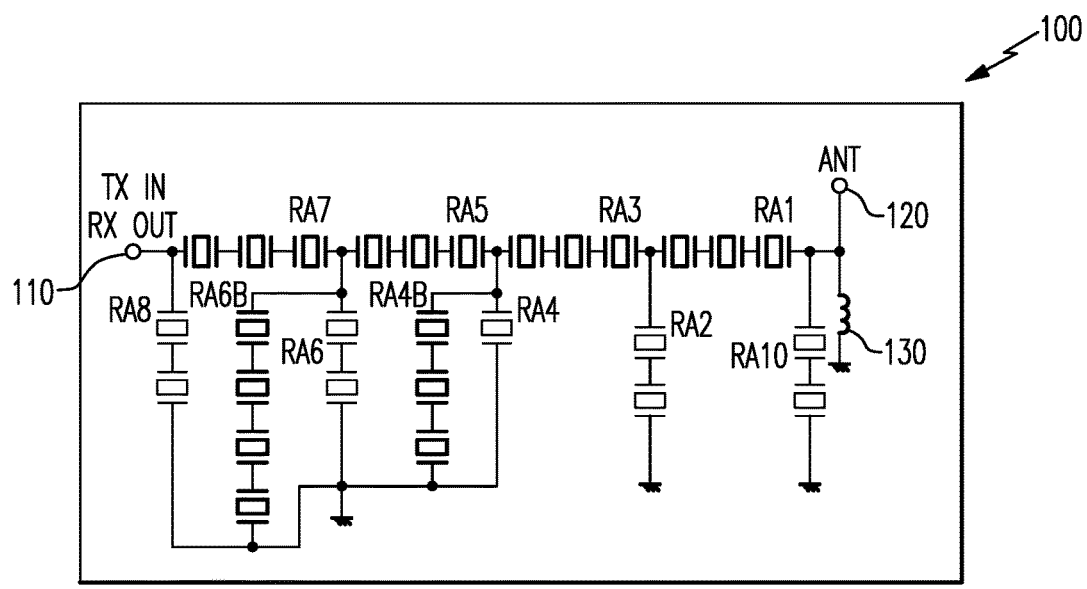
FIG. 2 shows a circuit diagram of the acoustic wave filter of FIG. 1.

The acoustic wave filter 500 of FIGS. 5 and 6 also differs from that in FIGS. 1 and 2 through the configuration of the ground connections. As best shown in FIG. 5, the ground connection terminals 550 are located so as to optimize the layout of the acoustic wave filter 500, minimizing the area occupied by the acoustic wave filter 500. A typical size of the acoustic wave filter 500 is 1.00×0.7 mm.

In the specific embodiment show in FIG. 6, the SAW resonator 400 of FIG. 4 is used as each of the SAW resonators included in the acoustic wave filter device 500. In other words all of the SAW resonators included in the acoustic wave filter 500 have mini bus bars in the IDT 300 with a width equal to 1 μm. In one specific embodiment, the layer of piezoelectric material 402 in each SAW resonator is formed from 128.8 LN (lithium niobate, 90 degrees rotation), and the layer of dielectric material 404 is formed from $SiO_2$. In one specific embodiment, the layer of dielectric material 404 is 430 nm thick in each of the SAW resonators in resonator arrays RA1, RA3, RA4B, RA5, RA6B, and RA7 (shown in bold in FIG. 6), and the layer of dielectric material 404 is 360 nm thick in each of the SAW resonators in resonator arrays RA0, RA2, RA4, RA6, and RA8.

Although in the above-described embodiment every SAW resonator in each resonator array includes the mini bus bar type IDT 300, in alternative embodiments only some of the SAW resonators included in the acoustic wave filter 500 may include the mini bus bars. In other words, in some embodiments only some of the SAW resonators in the acoustic wave filter 500 may include IDTs with bus bars with a width less than 3 μm, preferably less than 2 μm, more preferably less than 1 μm. In other embodiments, every SAW resonator may have mini bus bars in every IDT. The greatest improvement in size reduction and/or increase in power durability (without a size increase of the filter) is provided when all SAW resonators use IDTs with mini bus bars.

Figure 7:
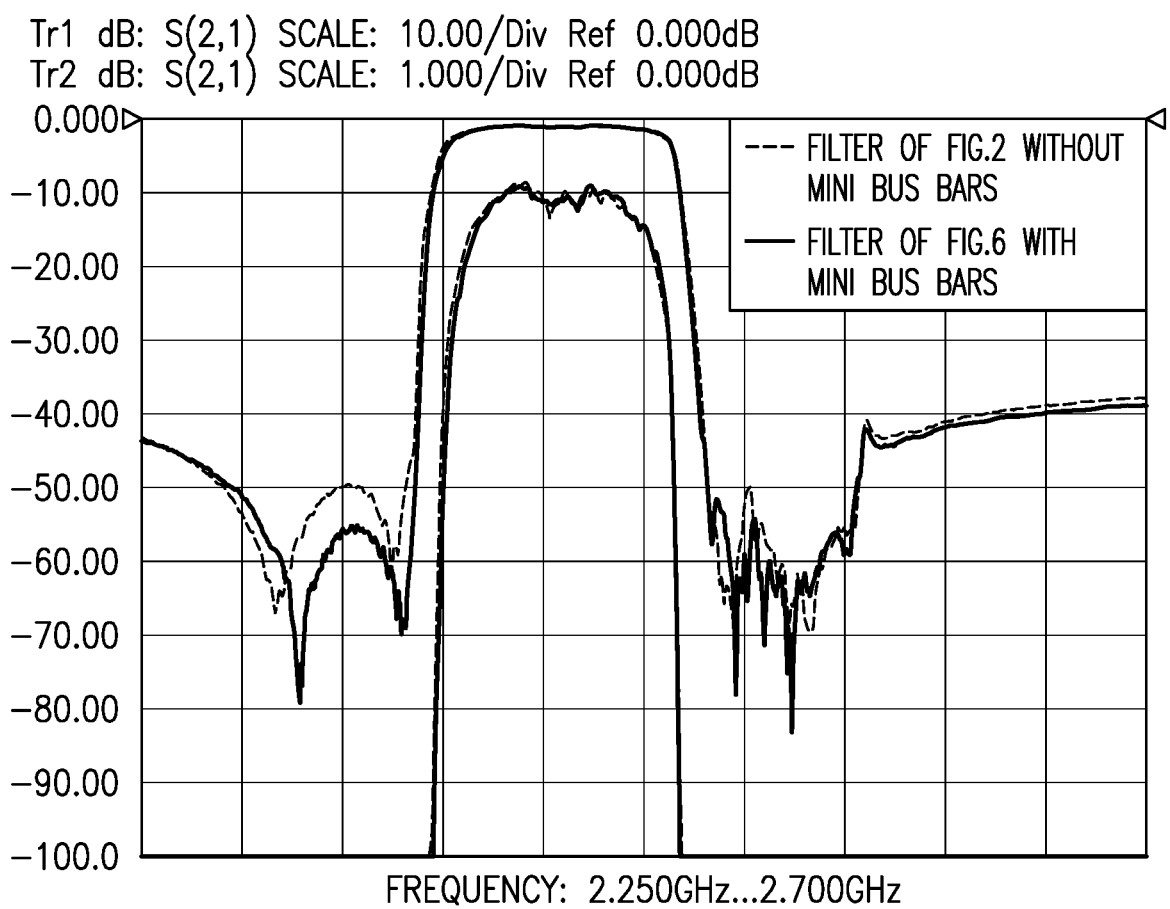
FIG. 7 is a graph showing transmission characteristics of an acoustic wave filter in an embodiment of the present disclosure.

FIG. 7 is a graph showing transmission characteristics for the acoustic wave filter 500 of FIGS. 5 and 6, compared to the acoustic wave filter 100 of FIGS. 1 and 2. In the specific embodiment of FIGS. 5 and 6, the acoustic wave filter is configured for the Wi-Fi band between approximately 2402.5 MHz and 2481.5 MHz. As can be seen from FIG. 7, the transmission characteristics are improved for the acoustic wave filter 500 of FIGS. 5 and 6, despite the reduction in the width of the bus bars. Namely, for the first trace (Tr1), transmission characteristics of the acoustic wave filter 500 for the B40 ATT and B41 ATT frequency bands are improved (see the deeper sections of the first trace between −50 and −80 dB for the acoustic wave filter 500 of FIGS. 5 and 6). As seen from the second trace (Tr2), which is the same as the first trace but with 1 dB per division on the y axis so as to focus on the 0 to −10 dB range of the first trace, the spurious signals are also improved (see the smaller ripple in the passband for the acoustic wave filter 500 of FIGS. 5 and 6).

Figure 8:
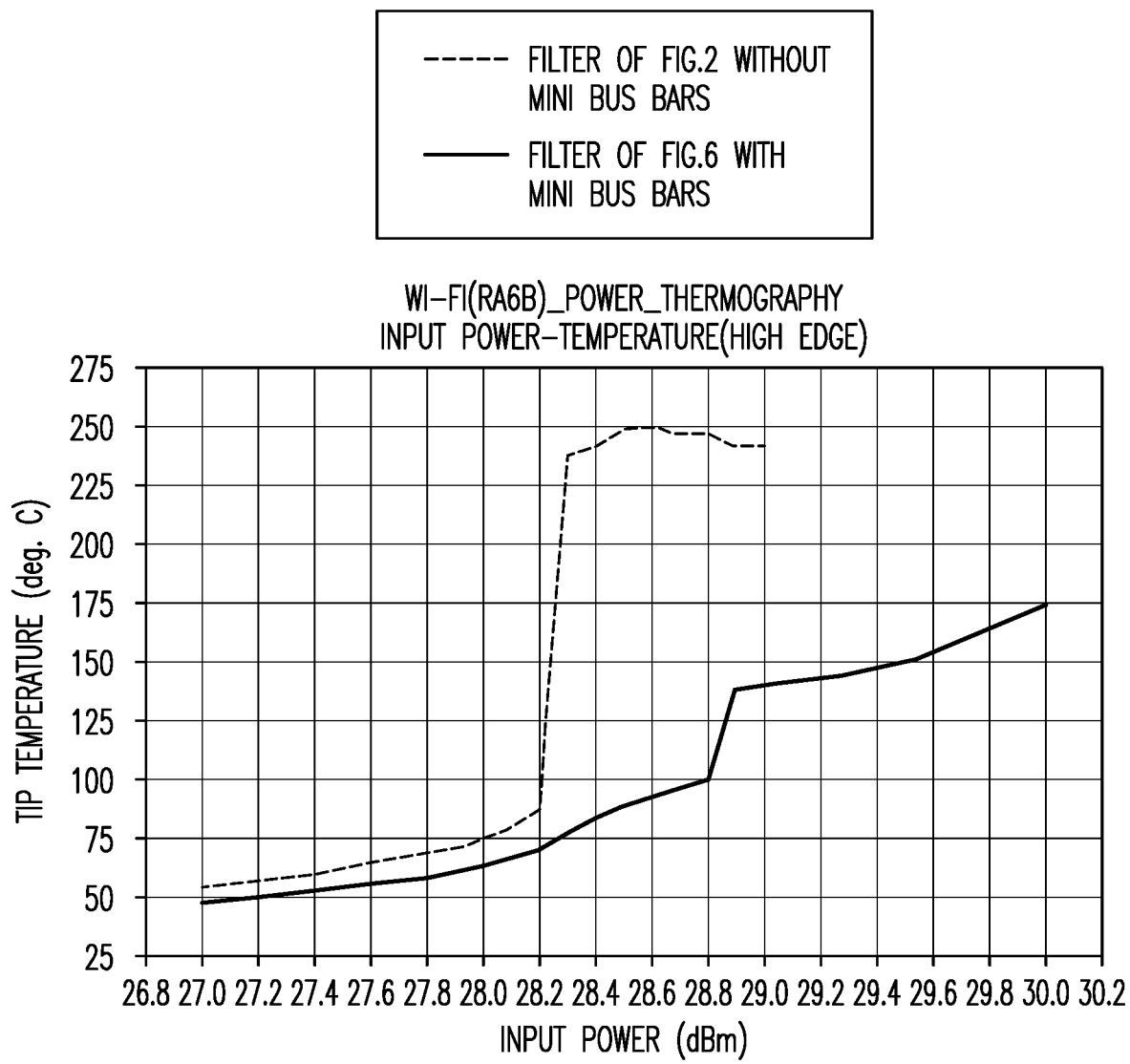
FIG. 8 is a graph showing the effect of input power on an acoustic wave filter in an embodiment of the present disclosure.

FIG. 8 is a graph showing the effect of input power on the performance of the acoustic wave filter 500 of FIGS. 5 and 6, compared to the acoustic wave filter 100 of FIGS. 1 and 2. Specifically, FIG. 8 shows the tip temperature of the electrode fingers in the IDTs in resonator array RA6B. The graph is measured at the high edge frequency (2481.5 MHz) of the waveband shown in FIG. 7.

As can be seen from FIG. 8, the power durability is improved for the acoustic wave filter 500 of FIGS. 5 and 6, due to the additional cascaded SAW resonators. This improvement is achieved without a size increase of the SAW filter due to the mini bus bars. Specifically, as seen in FIG. 8, for the acoustic wave filter 100 of FIGS. 1 and 2 the input power at breakage is equal to 28.3 dBm, with a tip temperature of 237.7° C. In contrast, the acoustic wave filter 500 of FIGS. 5 and 6 remains undamaged at input powers up to 30 dBm, with a tip temperature of 175° C. at 30 dBm input power. In other words, the acoustic wave filter 500 with mini bus bars has enhanced power handling and improved power durability. An increase in power durability will lead to an increase in the lifetime of the component.

The mini bus bars as described above can be applied to all other products in order to improve power durability and increase the density of cascaded resonators. In particular, the acoustic wave device 300 including mini bus bars with a width less than 3 μm, preferably less than 2 μm, more preferably less than 1 μm could be used in various types and configurations of SAW filters, such as RF ladder filters, or any filter with a plurality of series resonators and/or a plurality of parallel (or shunt) resonators. Other filter structures and other circuit structures known in the art that include SAW devices or resonators, for example, duplexers, baluns, etc., may also be formed using examples of the acoustic wave device 300 with mini bus bars as disclosed herein.

Figure 9:
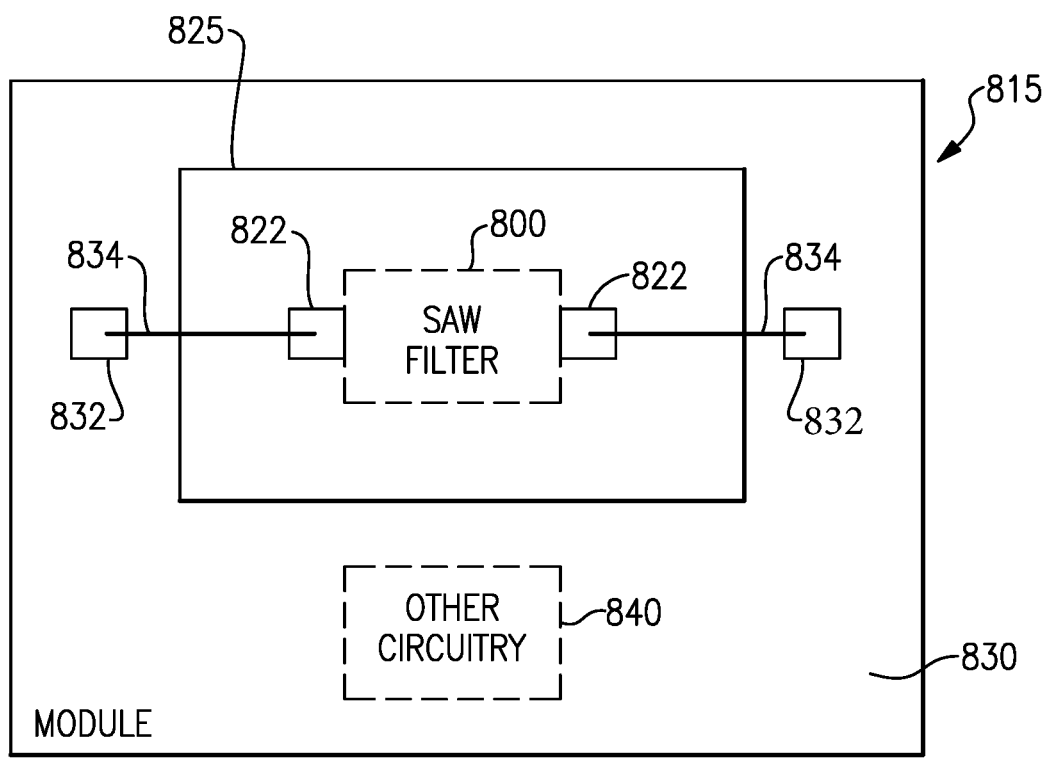
FIG. 9 is a block diagram of one example of a filter module that can include one or more acoustic wave devices according to aspects of the present disclosure.

In general, SAW filters, such as the acoustic wave filter 500 of FIGS. 5 and 6, may be incorporated into and packaged as a module that may ultimately be used in an electronic device, such as a wireless communications device, for example. FIG. 9 is a block diagram illustrating one example of a module 815 including a SAW filter 800. The SAW filter 800 may be implemented on one or more die(s) 825 including one or more connection pads 822. For example, the SAW filter 800 may include a connection pad 822 that corresponds to an input contact for the SAW filter and another connection pad 822 that corresponds to an output contact for the SAW filter. The packaged module 815 includes a packaging substrate 830 that is configured to receive a plurality of components, including the die 825. A plurality of connection pads 832 can be disposed on the packaging substrate 830, and the various connection pads 822 of the SAW filter die 825 can be connected to the connection pads 832 on the packaging substrate 830 via electrical connectors 834, which can be solder bumps or wirebonds, for example, to allow for passing of various signals to and from the SAW filter 800. The module 815 may optionally further include other circuitry die 840, for example, one or more additional filter(s), amplifiers, pre-filters, modulators, demodulators, down converters, and the like, as would be known to one of skill in the art of semiconductor fabrication in view of the disclosure herein. In some embodiments, the module 815 can also include one or more packaging structures to, for example, provide protection and facilitate easier handling of the module 815. Such a packaging structure can include an overmold formed over the packaging substrate 830 and dimensioned to substantially encapsulate the various circuits and components thereon.

Various examples and embodiments of the SAW filter 800 can be used in a wide variety of electronic devices. For example, the SAW filter 800 can be used in an antenna duplexer, which itself can be incorporated into a variety of electronic devices, such as RF front-end modules and communication devices.

Figure 10:
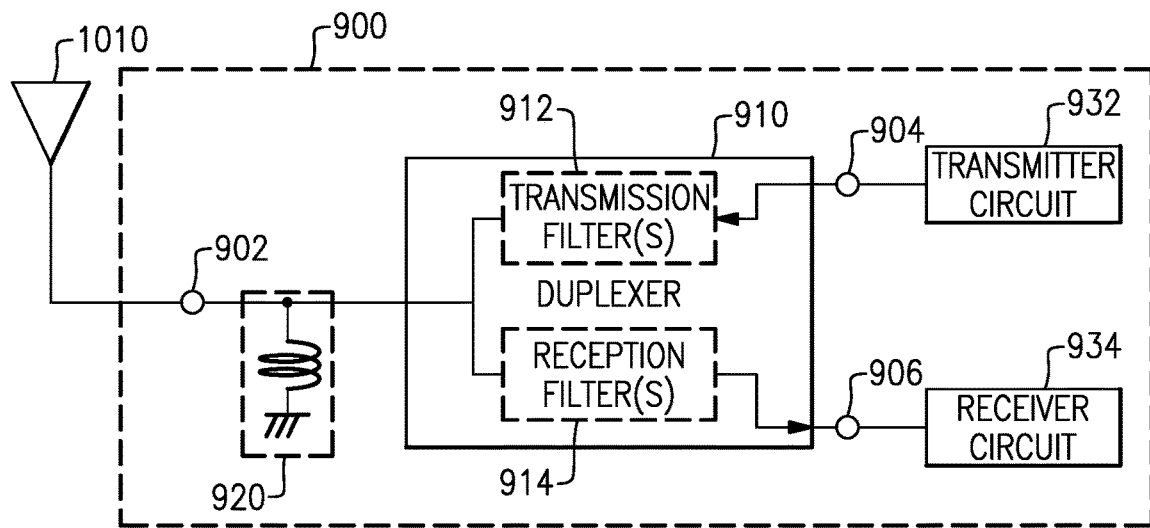
FIG. 10 is a block diagram of one example of a front-end module that can include one or more filter modules including acoustic wave devices according to aspects of the present disclosure.

Referring to FIG. 10, there is illustrated a block diagram of one example of a front-end module 900, which may be used in an electronic device such as a wireless communications device (e.g., a mobile phone) for example. The front-end module 900 includes an antenna duplexer 910 having a common node 902, an input node 904, and an output node 906. An antenna 1010 is connected to the common node 902.

The antenna duplexer 910 may include one or more transmission filters 912 connected between the input node 904 and the common node 902, and one or more reception filters 914 connected between the common node 902 and the output node 906. The passband(s) of the transmission filter(s) are different from the passband(s) of the reception filters. Examples of the SAW filter 800 can be used to form the transmission filter(s) 912 and/or the reception filter(s) 914. An inductor or other matching component 920 may be connected at the common node 902.

The front-end module 900 further includes a transmitter circuit 932 connected to the input node 904 of the duplexer 910 and a receiver circuit 934 connected to the output node 906 of the duplexer 910. The transmitter circuit 932 can generate signals for transmission via the antenna 1010, and the receiver circuit 934 can receive and process signals received via the antenna 1010. In some embodiments, the receiver and transmitter circuits are implemented as separate components, as shown in FIG. 10, however, in other embodiments these components may be integrated into a common transceiver circuit or module. As will be appreciated by those skilled in the art, the front-end module 900 may include other components that are not illustrated in FIG. 10 including, but not limited to, switches, electromagnetic couplers, amplifiers, processors, and the like.

Figure 11:
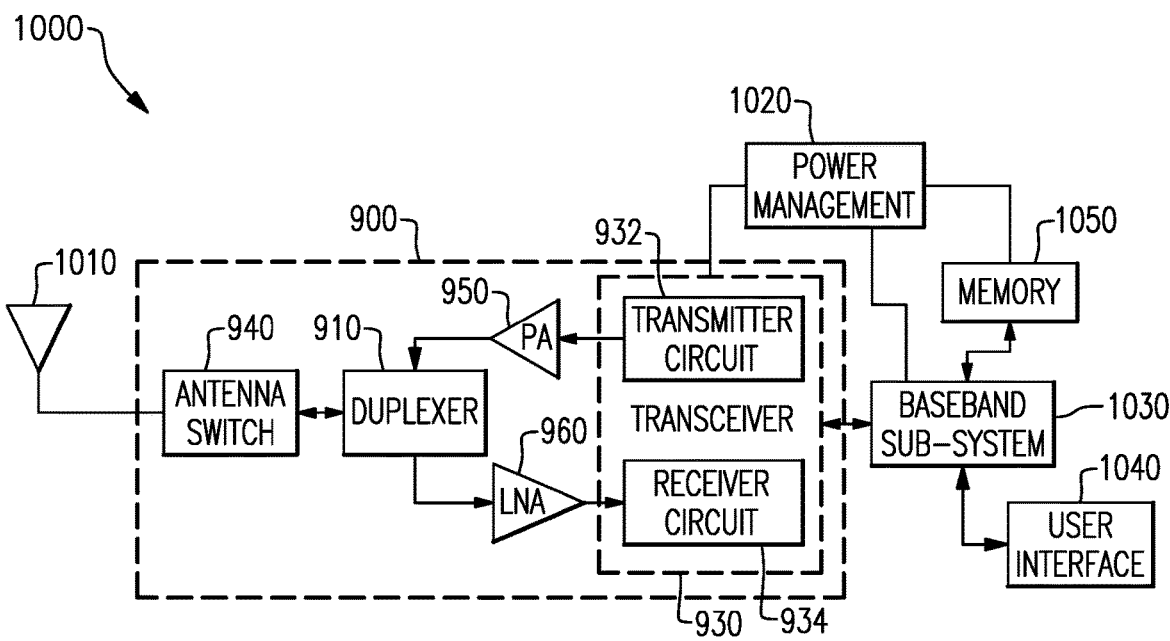
FIG. 11 is a block diagram of one example of a wireless device including the front-end module of FIG. 10.

FIG. 11 is a block diagram of one example of a wireless device 1000 including the antenna duplexer 910 shown in FIG. 10. The wireless device 1000 can be a cellular phone, smart phone, tablet, modem, communication network or any other portable or non-portable device configured for voice or data communication. The wireless device 1000 can receive and transmit signals from the antenna 1010. The wireless device includes an embodiment of a front-end module 900 similar to that discussed above with reference to FIG. 10. The front-end module 900 includes the duplexer 910, as discussed above. In the example shown in FIG. 11 the front-end module 900 further includes an antenna switch 940, which can be configured to switch between different frequency bands or modes, such as transmit and receive modes, for example. In the example illustrated in FIG. 11, the antenna switch 940 is positioned between the duplexer 910 and the antenna 1010; however, in other examples the duplexer 910 can be positioned between the antenna switch 940 and the antenna 1010. In other examples the antenna switch 940 and the duplexer 910 can be integrated into a single component.

The front-end module 900 includes a transceiver 930 that is configured to generate signals for transmission or to process received signals. The transceiver 930 can include the transmitter circuit 932, which can be connected to the input node 904 of the duplexer 910, and the receiver circuit 934, which can be connected to the output node 906 of the duplexer 910, as shown in the example of FIG. 10.

Signals generated for transmission by the transmitter circuit 932 are received by a power amplifier (PA) module 950, which amplifies the generated signals from the transceiver 930. The power amplifier module 950 can include one or more power amplifiers. The power amplifier module 950 can be used to amplify a wide variety of RF or other frequency-band transmission signals. For example, the power amplifier module 950 can receive an enable signal that can be used to pulse the output of the power amplifier to aid in transmitting a wireless local area network (WLAN) signal or any other suitable pulsed signal. The power amplifier module 950 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 950 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 11, the front-end module 900 may further include a low noise amplifier (LNA) module 960, which amplifies received signals from the antenna 1010 and provides the amplified signals to the receiver circuit 934 of the transceiver 930.

The wireless device 1000 of FIG. 11 further includes a power management sub-system 1020 that is connected to the transceiver 930 and manages the power for the operation of the wireless device 1000. The power management system 1020 can also control the operation of a baseband sub-system 1030 and various other components of the wireless device 1000. The power management system 1020 can include, or can be connected to, a battery (not shown) that supplies power for the various components of the wireless device 1000. The power management system 1020 can further include one or more processors or controllers that can control the transmission of signals, for example. In one embodiment, the baseband sub-system 1030 is connected to a user interface 1040 to facilitate various input and output of voice and/or data provided to and received from the user. The baseband sub-system 1030 can also be connected to memory 1050 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 500 MHz to 3 GHz.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave device, comprising:
   a first interdigital transducer electrode having a first bus bar and a first plurality of electrode fingers extending from the first bus bar in a first direction, the first bus bar having a width of 1 µm or less in a direction parallel to the first direction; and
   a second interdigital transducer electrode having a second bus bar and a second plurality of electrode fingers extending from the second bus bar in a second direction and interleaved with the first plurality of electrode fingers, the second bus bar having a width of 1 µm or less in a direction parallel to the second direction.

2. The acoustic wave device of claim 1 wherein the first bus bar and second bus bar are parallel and opposing.

3. The acoustic wave device of claim 1 wherein the first plurality of electrode fingers and second plurality of electrode fingers alternate in a direction perpendicular to the first direction.

4. The acoustic wave device of claim 1 wherein a separation between each of the first plurality of electrode fingers and an adjacent one of the second plurality of electrode fingers is equal to a distance of 2/2, where 2 is the wavelength of a main surface acoustic wave generated by the first interdigital transducer electrode and second interdigital transducer electrode.

5. The acoustic wave device of claim 1 wherein the first interdigital transducer electrode and second interdigital transducer electrode include at least one of aluminum, titanium, chromium, molybdenum, tungsten, copper, gold, silver, platinum, ruthenium, or iridium.

6. The acoustic wave device of claim 1 further comprising a layer of piezoelectric material.

7. The acoustic wave device of claim 6 wherein the first and second interdigital transducer electrodes are disposed on a surface of the layer of piezoelectric material.

8. The acoustic wave device of claim 1 further comprising a layer of dielectric material.

9. The acoustic wave device of claim 8 wherein the layer of dielectric material is disposed over the first and second interdigital transducer electrodes.

10. The acoustic wave device of claim 1 wherein the acoustic wave device is one of a surface acoustic wave device or a surface acoustic wave resonator.

11. An acoustic wave filter comprising a plurality of acoustic wave devices, at least one of the plurality of acoustic wave devices including:
    a first interdigital transducer electrode having a first bus bar and a first plurality of electrode fingers extending from the first bus bar in a first direction, the first bus bar having a width of 1 µm or less in a direction parallel to the first direction; and
    a second interdigital transducer electrode having a second bus bar and a second plurality of electrode fingers extending from the second bus bar in a second direction and interleaved with the first plurality of electrode fingers, the second bus bar having a width of 1 µm or less in a direction parallel to the second direction.

12. The acoustic wave filter of claim 11 wherein all of the plurality of acoustic wave devices include:
    a first interdigital transducer electrode having a first bus bar and a first plurality of electrode fingers extending from the first bus bar in the first direction, the first bus bar having a width of 1 µm or less in a direction parallel to the first direction; and
    a second interdigital transducer electrode having a second bus bar and a second plurality of electrode fingers extending from the second bus bar in the second direction and interleaved with the first plurality of electrode fingers, the second bus bar having a width of 1 µm or less in a direction parallel to the second direction.

13. The acoustic wave filter of claim 11 wherein the plurality of acoustic wave devices includes at least one array including two or more cascaded acoustic wave devices.

14. The acoustic wave filter of claim 11 wherein the plurality of acoustic wave devices includes an array with a cascade of more than five acoustic wave devices.

15. The acoustic wave filter of claim 11 further comprising an inductor connected in series between an input/output terminal and the plurality of acoustic wave devices.

16. The acoustic wave filter of claim 11 wherein an input breakage power of the acoustic wave filter is greater than 31 decibel-milliwatts.

17. An electronics module comprising at least one acoustic wave filter that includes a plurality of acoustic wave devices, at least one of the plurality of acoustic wave devices including:
    a first interdigital transducer electrode having a first bus bar and a first plurality of electrode fingers extending from the first bus bar in a first direction, the first bus bar having a width of 1 µm or less in a direction parallel to the first direction; and
    a second interdigital transducer electrode having a second bus bar and a second plurality of electrode fingers extending from the second bus bar in a second direction and interleaved with the first plurality of electrode fingers, the second bus bar having a width of 1 µm or less in a direction parallel to the second direction.

* * * * *

UNITED STATES PATENT AND TRADEMARK OFFICE
CERTIFICATE OF CORRECTION

| | | |
|---|---|---|
| PATENT NO. | : 12,294,351 B2 | Page 1 of 1 |
| APPLICATION NO. | : 18/062665 | |
| DATED | : May 6, 2025 | |
| INVENTOR(S) | : Akira Ochiai | |

It is certified that error appears in the above-identified patent and that said Letters Patent is hereby corrected as shown below:

In the Specification

Column 5, Line 31, insert -- $\lambda$ -- after "wavelength"

In the Claims

Column 13, Line 36, Claim 4, delete "2/2" and insert -- $\lambda/2$ --
Column 13, Line 36, Claim 4, delete "2" and insert -- $\lambda$ --

Signed and Sealed this
Third Day of June, 2025

Coke Morgan Stewart
*Acting Director of the United States Patent and Trademark Office*